(12) United States Patent  (10) Patent No.: US 8,826,110 B2
Jin et al.  (45) Date of Patent: Sep. 2, 2014

(54) SYSTEMS AND METHODS FOR DEFECT SCANNING

(75) Inventors: Ming Jin, Fremont, CA (US); Fan Zhang, Milpitas, CA (US); Lei Chen, Santa Clara, CA (US); AbdelHakim S. Alhussein, Milpitas, CA (US)

(73) Assignee: LSI Corporation, San Jose, CA (US)

( * ) Notice: Subject to any disclaimer, the term of this patent is extended or adjusted under 35 U.S.C. 154(b) by 108 days.

(21) Appl. No.: 13/551,523

(22) Filed: Jul. 17, 2012

(65) Prior Publication Data

US 2014/0026004 A1 Jan. 23, 2014

(51) Int. Cl.
*H03M 13/03* (2006.01)

(52) U.S. Cl.
USPC .......................... 714/793; 714/794; 714/758

(58) Field of Classification Search
CPC .............................. H04L 1/0059; H03M 13/43
USPC ................... 714/793, 794, 758, 701
See application file for complete search history.

(56) References Cited

U.S. PATENT DOCUMENTS

| | | | |
|---|---|---|---|
| 4,833,679 A * | 5/1989 | Anderson et al. ............. | 714/758 |
| 5,802,069 A | 9/1998 | Coulson | |
| 6,065,149 A | 5/2000 | Yamanaka | |
| 6,301,679 B1 | 10/2001 | Tan | |
| 6,446,236 B1 | 9/2002 | McEwen et al. | |
| 6,557,113 B1 | 4/2003 | Wallentine | |
| 6,691,263 B2 | 2/2004 | Vasic et al. | |
| 6,697,977 B2 | 2/2004 | Ozaki | |
| 6,731,442 B2 | 5/2004 | Jin et al. | |
| 6,738,948 B2 | 5/2004 | Dinc et al. | |
| 6,980,382 B2 | 12/2005 | Hirano et al. | |
| 7,154,936 B2 | 12/2006 | Bjerke et al. | |
| 7,168,030 B2 | 1/2007 | Ariyoshi | |
| 7,203,015 B2 | 4/2007 | Sakai et al. | |
| 7,237,173 B2 | 6/2007 | Morita et al. | |
| 7,254,192 B2 | 8/2007 | Onggosanusi | |
| 7,257,172 B2 | 8/2007 | Okamoto et al. | |
| 7,359,313 B2 | 4/2008 | Chan et al. | |
| 7,441,174 B2 | 10/2008 | Li et al. | |
| 7,457,212 B2 | 11/2008 | Oh | |
| 7,652,966 B2 | 1/2010 | Kadokawa | |
| 7,688,915 B2 | 3/2010 | Tanrikulu et al. | |
| 7,702,973 B2 | 4/2010 | Mead | |
| 7,849,385 B2 | 12/2010 | Tan | |
| 7,852,722 B2 | 12/2010 | Kikugawa et al. | |
| 7,924,518 B2 | 4/2011 | Mathew | |
| 7,952,824 B2 | 5/2011 | Dziak | |

(Continued)

FOREIGN PATENT DOCUMENTS

| | | |
|---|---|---|
| EP | 0549151 | 6/1993 |
| EP | 1096491 | 10/2005 |

(Continued)

OTHER PUBLICATIONS

Bagul, Y.,G.: "Assessment of current health and remaining useful life of hard disk drives" [online] Jan. 1, 2009 [retrieved on Oct. 14, 2010] Retrieved from the internet<URL;htt.

(Continued)

*Primary Examiner* — Fritz Alphonse
(74) *Attorney, Agent, or Firm* — Hamilton DeSanctis & Cha

(57) ABSTRACT

The present invention is related to systems and methods for defect scanning.

20 Claims, 5 Drawing Sheets

(56) References Cited

U.S. PATENT DOCUMENTS

| | | |
|---|---|---|
| 8,095,855 B2 | 1/2012 | Tan |
| 8,121,224 B2 | 2/2012 | Tan |
| 8,139,457 B2 | 3/2012 | Cao |
| 8,149,527 B2 | 4/2012 | Tan |
| 8,161,357 B2 | 4/2012 | Tan |
| 8,176,400 B2 | 5/2012 | Tan |
| 8,190,831 B2 | 5/2012 | Lee et al. |
| 8,201,051 B2 | 6/2012 | Tan |
| 8,219,892 B2 | 7/2012 | Tan |
| 2002/0041459 A1 | 4/2002 | Singer |
| 2003/0043487 A1 | 3/2003 | Morita et al. |
| 2003/0147172 A1 | 8/2003 | Singer et al. |
| 2007/0061687 A1 | 3/2007 | Hwang |
| 2010/0042877 A1 | 2/2010 | Tan |
| 2010/0229031 A1 | 9/2010 | Tan |
| 2010/0268996 A1 | 10/2010 | Yang |
| 2010/0269023 A1 | 10/2010 | Yang |
| 2011/0205653 A1 | 8/2011 | Mathew |
| 2011/0209026 A1 | 8/2011 | Xia |
| 2012/0087033 A1 | 4/2012 | Yang |
| 2012/0254679 A1 | 10/2012 | Tan |
| 2012/0266055 A1 | 10/2012 | Zhang |

FOREIGN PATENT DOCUMENTS

| | | |
|---|---|---|
| JP | 10-145243 | 5/1998 |
| JP | 2007-087529 | 4/2007 |
| WO | WO 01/39188 | 5/2001 |

OTHER PUBLICATIONS

ECMA: Standardizing Information and Communication Systems: "Standard ECMA-272: 120 mm DVD Rewritable Disk (DVD-RAM)" Standard ECMA, , No. 272, Feb. 1, 1998 pp. 43-51.

Galbraith et al, "Iterative Detection Read Channel Technology in Hard Disk Drives" [online] Oct. 1, 2008 [ret. on Oct. 1, 2008] Ret. from Internet<URL:http://www.hitachigst.com.

Kavcic et al., "A Signal-Dependent Autoregressive Channel Model", IEEE Transactions on Magnetics, vol. 35, No. 5, Sep. 1999 pp. 2316-2318.

U.S. Appl. No. 13/547,516, filed Jul. 12, 2012, Jefferson E. Singleton, Unpublished.

U.S. Appl. No. 13/525,194, filed Jun. 15, 2012, Bruce Wilson, Unpublished.

U.S. Appl. No. 13/459,289, filed Apr. 30, 2012, Fan Zhang, Unpublished.

U.S. Appl. No. 13/452,722, filed Apr. 20, 2012, Shaohua Yang, Unpublished.

U.S. Appl. No. 13/213,789, filed Aug. 19, 2011, Ming Jin, Unpublished.

U.S. Appl. No. 13/368,599, filed Feb. 8, 2012, Yang Cao, Unpublished.

\* cited by examiner

US 8,826,110 B2

SYSTEMS AND METHODS FOR DEFECT SCANNING

BACKGROUND OF THE INVENTION

The present invention is related to systems and methods for defect detection, and more specifically to systems and methods for defect scanning.

Part of disk drive manufacturing involves scanning a storage medium associated with the disk drive for defects. Traditionally, a periodic pattern is written on wedges. To detect a media defect, a wedge read is performed and media defect is declared if the amplitude of the read back signal is less than a threshold. Where a defect is identified in the wedge, the entire sector associated with the wedge is identified as unusable and mapped out. Such an approach may waste considerable otherwise usable area on the storage medium.

Hence, for at least the aforementioned reasons, there exists a need in the art for advanced systems and methods for defect detection.

BRIEF SUMMARY OF THE INVENTION

The present invention is related to systems and methods for defect detection, and more specifically to systems and methods for defect scanning.

Various embodiments of the present invention provide data processing system that include a data decoder circuit and a sector defect indication circuit. The data decoder circuit is selectably operable to converge with a first syndrome value or a second syndrome value. The first syndrome value corresponds to a test pattern, and the second syndrome value corresponds to an encoded data set. The sector defect indication circuit is operable to identify a region of a storage medium as defective based at least in part on failure of the data decoder circuit to converge with the first syndrome value.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS OF THE INVENTION

Figure 1:
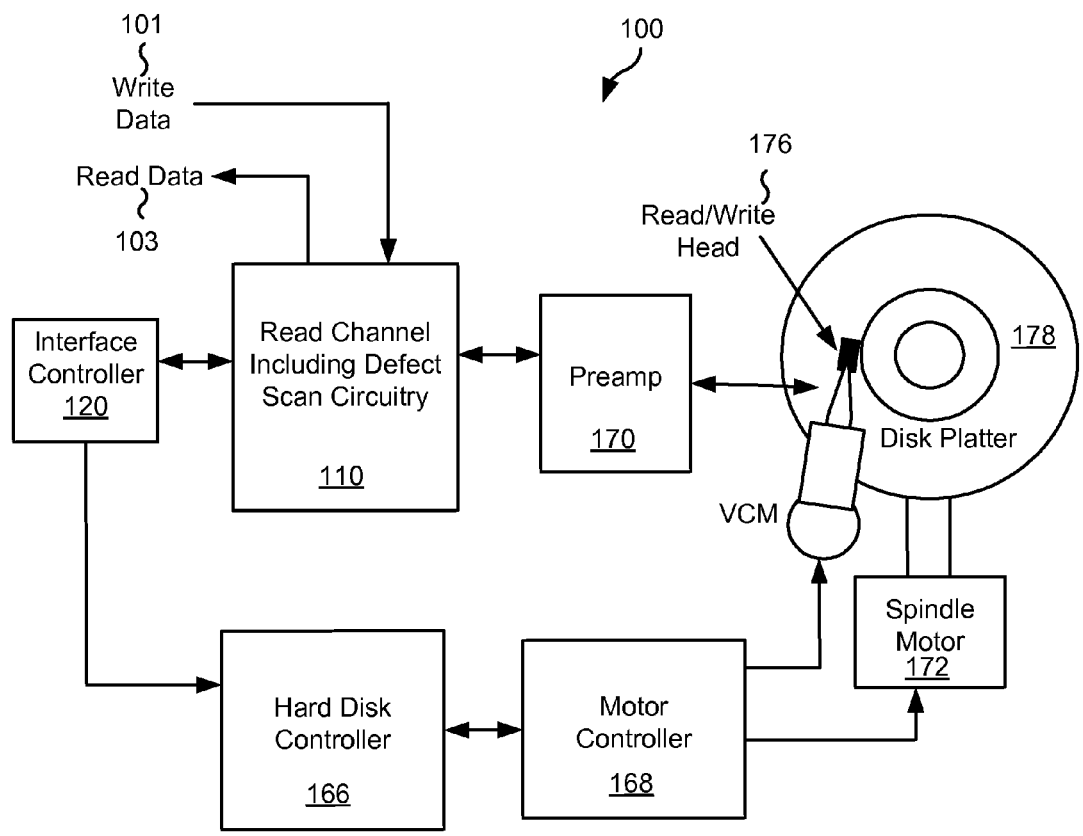
FIG. 1 shows a storage device including a read channel having defect scanning circuitry in accordance with one or more embodiments of the present invention.

The present invention is related to systems and methods for defect detection, and more specifically to systems and methods for defect scanning.

Various embodiments of the present invention provides for defect scanning utilizing circuitry of a standard read channel. For test purposes, a periodic pattern is written to a storage medium. The periodic pattern is not conformed to a standard low density parity check (LDPC) codeword, and thus will fail standard LDPC decoding. This is because the periodic pattern exhibits a non-zero syndrome value when LDPC decoding is applied to the periodic pattern in contrast to a standard LDPC codeword that exhibits a syndrome value of zero. This non-zero syndrome value is calculated, and for test purposes the syndrome value corresponding to a valid LDPC codeword is switched to the non-zero syndrome value of the periodic pattern. Thus, during a test process, the periodic pattern will appear to be a valid LDPC codeword where the LDPC decoding results in the expected non-zero syndrome value. Thus, a sector programmed with the periodic pattern that yields a convergence of the modified LDPC decoding algorithm is considered defect free, and a sector that does not converge is considered defective and mapped out. In some cases, the periodic pattern is a 2 T pattern, but may be any periodic pattern including, but not limited to a 1 T, 3 T, or 4 T pattern. As is known in the art, the symbol T indicates a period.

Processing of data retrieved from the storage medium may include application of a data detection algorithm to yield a detected output, followed by applying a data decoding algorithm to yield a decoded output. Applying the data detection algorithm followed by applying the data decoding algorithm is considered a "global iteration". In some cases, a number of iterations applying the data decoding algorithm may occur during any given global iterations. These repeated applications of the data decoding algorithm during a global iteration are referred to as "local iterations". In some cases of the aforementioned embodiments, the number of allowed global and/or local iterations can be adjusted such that better sectors are differentiated from marginal sectors. Sectors that have a large percentage of defective area will not converge to the non-zero syndrome value regardless of how many global and local iterations are applied. In contrast, sectors that have very few defects will converge to the non-zero syndrome value after relatively few global and/or local iterations. Sectors with an intermediate number of defects will converge, but only after a larger number of global and/or local iterations than that required for the sectors with a low percentage of defective area. By modifying the number of allowable global and/or local iterations applied to processing the periodic pattern, a threshold of defects per sector can effectively be set.

Various embodiments of the present invention provide data processing system that include a data decoder circuit and a sector defect indication circuit. The data decoder circuit is selectably operable to converge with a first syndrome value or a second syndrome value. The first syndrome value corresponds to a test pattern, and the second syndrome value corresponds to an encoded data set. The sector defect indication circuit is operable to identify a region of a storage medium as defective based at least in part on failure of the data decoder circuit to converge with the first syndrome value. In some instances of the aforementioned embodiments, the data processing system is implemented as part of a storage device. In various instances of the aforementioned embodiments, the data processing system is implemented as part of an integrated circuit.

In some instances of the aforementioned embodiments, the region of the storage medium corresponds to the region from which the test pattern is stored. In various instances of the aforementioned embodiments, the first syndrome value is non-zero and the second syndrome value is zero. In some such instances, the first syndrome value is the value resulting from applying a data decoding algorithm by the data decoder circuit to the test pattern. In one or more instances of the aforementioned embodiments, the test pattern is a 2 T pattern. In particular instances of the aforementioned embodiments, the data processing system further includes a data detection circuit operable to apply a data detection algorithm to a data input to yield a detected output. In such instances, the data decoder circuit is operable to apply a data decoding algorithm to a data set derived from the detected output.

Turning to FIG. 1, a storage system 100 including a read channel circuit 110 having memory re-use for interim data decoder state circuitry is shown in accordance with some embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

During standard reads and write processes, data is stored to disk platter 178 and re-read from disk platter and processed. During testing, a periodic pattern is stored to sectors of disk platter 178. This periodic pattern is not conformed to a standard low density parity check (LDPC) codeword, and thus will fail standard LDPC decoding when re-read from disk platter 178. This is because the periodic pattern exhibits a non-zero syndrome value when LDPC decoding is applied to the periodic pattern in contrast to a standard LDPC codeword that exhibits a syndrome value of zero. This non-zero syndrome value is calculated, and for test purposes the syndrome value corresponding to a valid LDPC codeword is switched to the non-zero syndrome value of the periodic pattern. Thus, during a test process, the periodic pattern will appear to be a valid LDPC codeword where the LDPC decoding results in the expected non-zero syndrome value. Thus, a sector programmed with the periodic pattern that yields a convergence of the modified LDPC decoding algorithm is considered defect free, and a sector that does not converge is considered defective and mapped out (i.e., identified as unusable). In some embodiments of the present invention, data processing circuits similar to those discussed below in relation to FIG. 2, and/or the processing may be done similar to that discussed below in relation to FIGS. 3a-3d.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

The data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platter 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
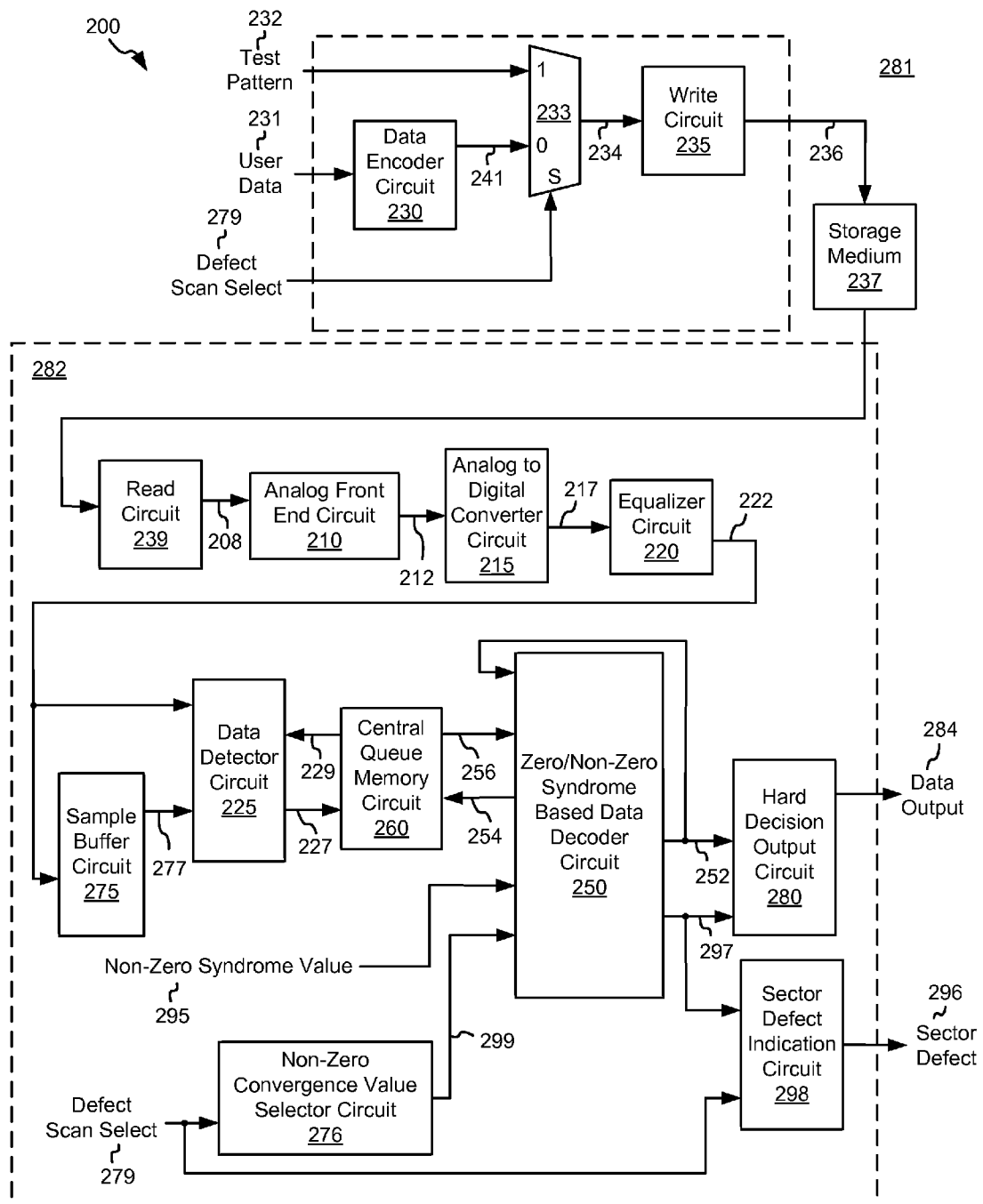
FIG. 2 shows a data processing circuit including defect scanning circuitry in accordance with some embodiments of the present invention.

Turning to FIG. 2, a data processing circuit 200 is shown that includes defect scanning circuitry in accordance with some embodiments of the present invention. Data processing circuit 200 includes a write side circuit 281 and a read side circuit 282. Write side circuit 281 is operable to write either a test pattern 232 or an encoded data set 241 to a storage medium 237 depending upon an assertion level of a defect scan select signal 279. When a test process is selected by a user, defect scan select signal 279 is asserted such that test pattern 232 is written to storage medium 237. Alternatively, when standard processing is selected (or the test process is not selected) by the user, defect scan select signal 279 is asserted such that encoded data set 241 is written to storage medium 237. The selection is performed by a selector circuit 233 that provides a write output 234 to a write circuit 235. Test pattern 232 is a periodic pattern. In some embodiments of the present invention, test pattern 232 is a 2T pattern.

Encoded data set 241 is a user data set 231 that has been encoded by a data encoder circuit 230. In some embodiments of the present invention, data encoder circuit 230 includes a number of encoder circuits such as, for example, a cyclic redundancy check encoder circuit, a LDPC encoder circuit, and a run length limited encoder circuit as are known in the art. For the purposes of this discussion, encoder circuit 230 is discussed as an LDPC encoder circuit yielding an LDPC codeword that is provided as encoded data set 241. Such LDPC codewords are encoded such that a syndrome value of zero results when a subsequent decoding by an LDPC decoder circuit is applied. In contrast, a known non-zero syndrome value results when the same LDPC decoding is applied to test pattern 232.

Storage medium 237 may be any storage medium known in the art including, but not limited to, a magnetic disk storage medium, a solid state storage medium, or an optical storage medium. Based upon the disclosure provided herein, one of ordinary skill in the art will recognize a variety of storage media that may be used in relation to different embodiments of the present invention.

Write circuit 235 is operable to cause write output 234 to be stored to storage medium 237. Write circuit 235 may be any circuit or device known in the art that is capable of receiving a data set and formatting that data set for writing to storage medium 237. In some cases where storage medium 237 is a magnetic storage medium, write circuit 235 includes write circuitry that feeds a write pattern to a read/write head assembly that is operable to form magnetic patterns on the magnetic storage medium. Based upon the disclosure provided herein, one of ordinary skill in the art will recognize a variety of write circuits that may be used in relation to different embodiments of the present invention.

Read side circuit 282 is operable to read and process data from storage medium 237. Read side circuit 282 includes a read circuit 239 that is operable to sense information from storage medium 237 and to provide a corresponding data signal 208. In the case where storage medium 237 is a magnetic storage medium, read side circuit 282 includes a read head assembly operable to sense magnetic fields, and to convert the sensed magnetic fields into an analog electrical signal that is provided as data signal 208. Based upon the disclosure provided herein, one of ordinary skill in the art will recognize a variety of read circuits that may be used in relation to different embodiments of the present invention depending in part upon the type of media used to implement storage medium 237.

An analog front end circuit 210 receives an data input 208, and processes data input 208 to yield a processed analog signal 212 that is provided to an analog to digital converter circuit 215. Analog front end circuit 210 may include, but is not limited to, an analog filter and an amplifier circuit as are known in the art. Based upon the disclosure provided herein, one of ordinary skill in the art will recognize a variety of circuitry that may be included as part of analog front end circuit 210. Analog to digital converter circuit 215 converts processed analog signal 212 into a corresponding series of digital samples 217. Analog to digital converter circuit 215 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 217 are provided to an equalizer circuit 220. Equalizer circuit 220 applies an equalization algorithm to digital samples 217 to yield an equalized output 222. In some embodiments of the present invention, equalizer circuit 220 is a digital finite impulse response filter circuit as are known in the art.

Equalized output 222 is provided to both a data detector circuit 225 and to a sample buffer circuit 275. Sample buffer circuit 275 stores equalized output 222 as buffered data 277 for use in subsequent iterations through data detector circuit 225. Data detector circuit 225 may be any data detector circuit known in the art that is capable of producing a detected output 227. As some examples, data detector circuit 225 may be, but is not limited to, a Viterbi algorithm detector circuit or a maximum a posteriori detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Detected output 225 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 227 is provided to a central queue memory circuit 260 that operates to buffer data passed between data detector circuit 225 and zero/non-zero syndrome based data decoder circuit 250. In some cases, central queue memory circuit 260 includes interleaving (i.e., data shuffling) and de-interleaving (i.e., data un-shuffling) circuitry known in the art. When data decoder circuit 250 is available, data decoder circuit 250 accesses detected output 227 from central queue memory circuit 260 as a decoder input 256. Data decoder circuit 250 applies a data decoding algorithm to decoder input 256 in an attempt to recover originally written data. The result of the data decoding algorithm is provided as a decoded output 252. Similar to detected output 227, decoded output 252 may include both hard decisions and soft decisions. For example, data decoder circuit 250 may be any data decoder circuit known in the art that is capable of applying a decoding algorithm to a received input. Zero/non-zero syndrome based data decoder circuit 250 is programmable to indicate convergence (i.e., correct conclusion of the data decoding algorithm) based upon a syndrome value of zero when standard processing is ongoing, and based upon a known non-zero syndrome value corresponding to test pattern 232 where defect scan processing is ongoing. This difference in decoding between defect scan processing and standard processing is more thoroughly discussed below. Where the original data is recovered (i.e., the data decoding algorithm converges) or a timeout condition occurs, decoded output 252 is stored to a memory included in a hard decision output circuit 280. In turn, hard decision output circuit 280 provides the converged decoded output 252 as a data output 284 to a recipient (not shown). The recipient may be, for example, an interface circuit operable to receive processed data sets. Based upon the disclosure provided herein, one of ordinary skill in the art will recognize a variety of recipients that may be used in relation to different embodiments of the present invention. Where the original data is not recovered (i.e., the data decoding algorithm failed to converge) prior to a timeout condition, a decoder status output 297 indicates the failed condition indicating that the data is unusable.

One or more iterations through the combination of data detector circuit 225 and data decoder circuit 250 may be made in an effort to converge on the originally written data set. As mentioned above, processing through both the data detector circuit and the data decoder circuit is referred to as a "global iteration". For the first global iteration, data detector circuit 225 applies the data detection algorithm to equalized output 222 without guidance from a decoded output. For subsequent global iterations, data detector circuit 225 applies the data detection algorithm to buffered data 277 as guided by decoded output 252. Decoded output 252 is stored to central queue memory circuit 260, and is provided from central queue memory circuit 260 as a detector input 229.

During each global iteration it is possible for data decoder circuit 250 to make one or more local iterations including application of the data decoding algorithm to decoder input 256. For the first local iteration, data decoder circuit 250 applies the data decoder algorithm without guidance from decoded output 252. For subsequent local iterations, data decoder circuit 250 applies the data decoding algorithm to decoder input 256 as guided by a previous decoded output 252. The number of local iterations allowed may be, for example, ten. Based upon the disclosure provided herein, one of ordinary skill in the art will recognize a variety of different numbers of local iterations that may be allowed in accordance with different embodiments of the present invention. Where the number of local iterations through data decoder circuit 250 exceeds that allowed, but it is determined that at least one additional global iteration during standard processing of the data set is allowed, decoded output 252 is provided back to central queue memory circuit 260 as decoded output 254. Decoded output 254 is maintained in central queue memory circuit 260 until data detector circuit 225 becomes available to perform additional processing.

In contrast, where the number of local iterations through data decoder circuit 250 exceeds that allowed and it is determined that the allowable number of global iterations has been surpassed for the data set and/or a timeout or memory usage calls for termination of processing of the particular data set, standard processing of the data set concludes and the decoded output is provided as data output 252 with decoder status output 297 indicating that the data did not converge.

As mentioned above, when standard processing is ongoing, a syndrome value of zero is used to determine whether application of the data decoding algorithm by data decoded circuit 250 converged. In contrast, when a defect scan is being performed as indicated by an assertion level of defect scan select signal 279, a non-zero convergence value selector circuit 276 provides a non-zero selector signal 299 to data decoder circuit 250. Based upon assertion of non-zero selector signal 299 data decoder circuit 250 applies the same data decoding algorithm as that applied for standard processing, but indicates convergence when the syndrome value is equal to a non-zero syndrome value 295. Non-zero syndrome value 295 is calculated to be the expected result of the data decoding algorithm applied to test pattern 232, and may be stored to a register (not shown). Thus, when test pattern 232 is being received as equalized output 222, data decoder circuit 250 will indicate convergence when the syndrome value equals that provided as non-zero syndrome value 295.

Where defect scan select signal 279 is asserted to indicate a defect scan (i.e., a use of test pattern 232) and completion of the allowed global and local iterations results in non-convergence indicated by decoder status output 297, a sector defect indication circuit 298 asserts a sector defect output 296. A host (not shown) can then map the sector from which the test pattern was derived as unusable due to defects. Alternatively, where defect scan select signal 279 is asserted to indicate a defect scan (i.e., a use of test pattern 232) and completion of the allowed global and local iterations results in convergence indicated by decoder status output 297, a sector defect indication circuit 298 de-asserts a sector defect output 296. The host can then map the sector from which the test pattern was derived as unusable due to defects.

In some embodiments of the present invention, the number of allowed global iterations and/or local iterations can be different for standard processing and defect scan processing. For standard processing, the allowed global iterations and/or local iterations are selected to assure the convergence of the highest percentage of sectors within a defined latency characteristic. In contrast, in defect scan processing, the allowed global iterations and/or local iterations may be selected to operate as a threshold of acceptable numbers of defects in a region covered by a sector. Sectors that have a large percentage of defective area will not converge to non-zero syndrome value 295 regardless of how many global and local iterations are applied. In contrast, sectors that have very few defects will converge to non-zero syndrome value 295 after relatively few global and/or local iterations. Sectors with an intermediate number of defects will converge, but only after a larger number of global and/or local iterations than that required for the sectors with a low percentage of defective area. By modifying the number of allowable global and/or local iterations applied to processing the periodic pattern, a threshold of defects per sector can effectively be set.

Turing to FIGS. 3a-3d, flow diagrams 399, 300, 350, 345 depict a method in accordance with some embodiments of the present invention for data processing including defect scanning. Following flow diagram 399 of FIG. 3a, it is determined where defect scan processing has been selected (block 353). Such defect scan processing may be selected, for example, by a user through programming a register or moving a mechanical switch. Where defect scan processing has been selected (block 353), all sectors or regions of a storage medium are written with a periodic pattern (block 358). The test pattern corresponds to a known non-zero syndrome value. This non-zero syndrome value is the value that would result if a downstream data decoding algorithm is applied to the test pattern and the original test pattern is recovered. The periodic pattern may be, for example, a 2 T pattern. Alternatively, where defect scan processing is not selected (block 353), sectors or regions of the storage medium are written with user data when it is made available (block 363). Such user data is encoded to such that a syndrome value of zero results when the downstream data decoding algorithm is applied to the encoded data the original user data is recovered.

Figure 3A:
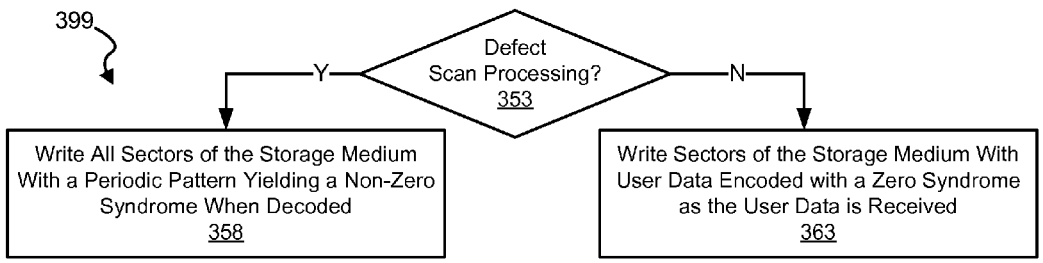
FIGS. 3a-3d are flow diagrams showing a method in accordance with some embodiments of the present invention for data processing including defect scanning.
Figure 3B:
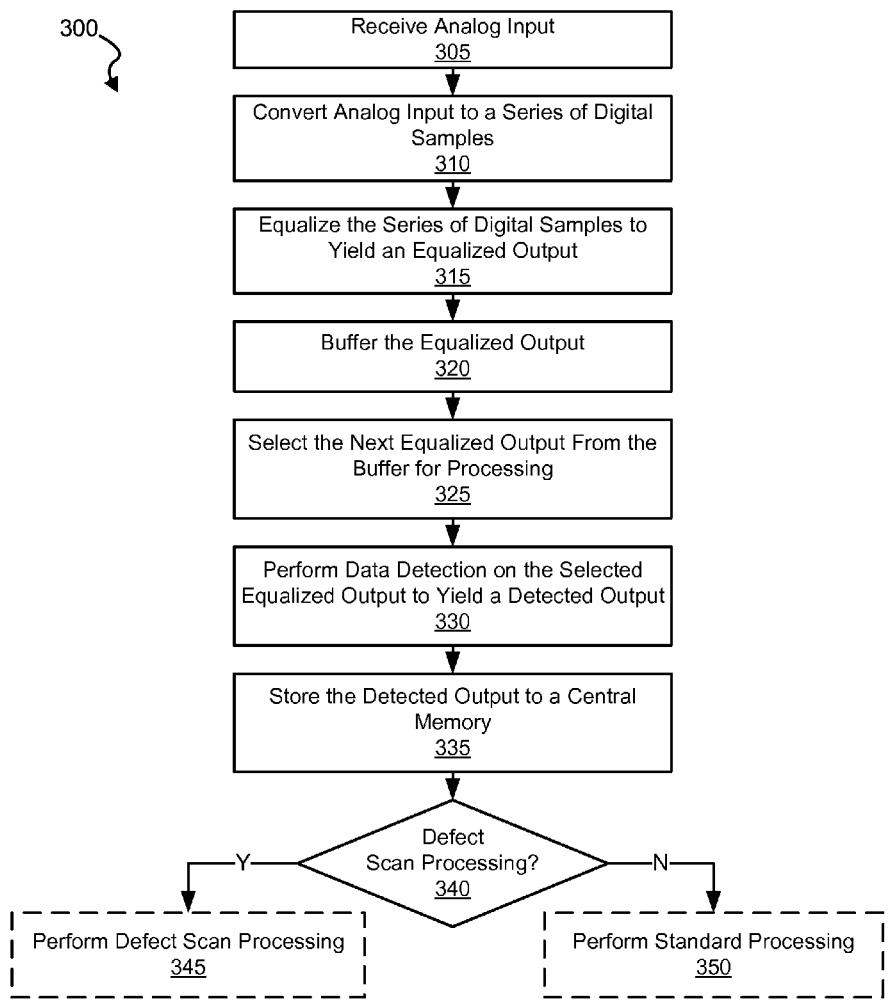

Turning to FIG. 3b and following flow diagram 300, an analog input is received (block 305). The analog input is received by accessing the storage medium written as described in relation to flow diagram 399 and corresponds to either the periodic pattern or the encoded user data depending upon whether defect scan processing was selected. The analog input is converted to a series of digital samples (block 310). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 315). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 320).

The next equalized output is selected from the buffer for processing (block 325). The processing includes applying a data detection algorithm to the selected equalized output to yield a detected output (block 330), and the detected output (or a derivative thereof) is stored to a central memory circuit (block 335). It is then determined whether defect scan processing is selected (block 340). Where defect scan processing is selected (i.e., processing test pattern data to discern defects) (block 340), defect scan processing is performed (block 345). Otherwise, where defect scan processing is not selected (block 340), standard processing is performed (block 350). Standard processing (block 350) and defect scan processing (block 345) are shown in dashed lines as they are discussed in more detail in the flow diagrams of FIGS. 3c-3d, respectively.

Figure 3C:
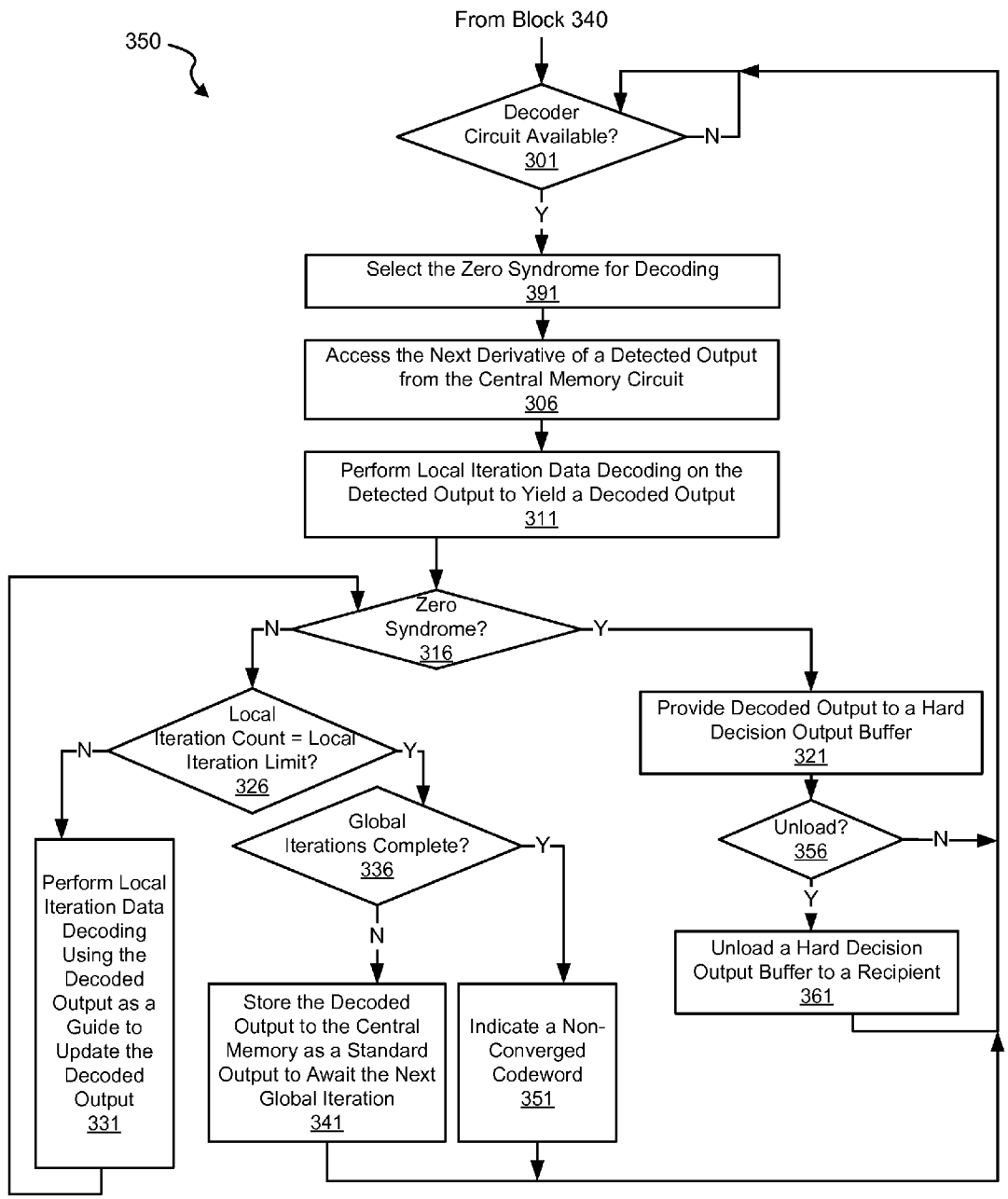

Turning to FIG. 3c, flow diagram 350 shows an implementation of the aforementioned defect scan processing. Following flow diagram 350, it is determined whether a decoder circuit is available to process a previously stored detected output (block 301). Where the decoder circuit is available (block 301), a syndrome value of zero is selected (block 391). The zero syndrome value corresponds to the result achieved when an encoded data set written as part of flow diagram 399 described above. The next derivative of a detected output is selected for processing and accessed from the central memory circuit (block 306). A first local iteration of a data decoding algorithm is applied by the data decoder circuit to the selected detected output to yield a decoded output (block 311).

It is then determined whether the decoded output converged with the syndrome value of zero (block 316). Where the decoded output converged with the syndrome value of zero (block 316), the decoded output is provided to a hard decision output buffer (block 321). It is then determined whether the hard decision output buffer is ready to be unloaded (block 356). In some cases, the hard decision output buffer is ready to be unloaded when the most recently completed decoded output is the next decoded output after that previously provided as a data output. Where the hard decision output buffer is ready to be unloaded (block 356), all of the continuous decoded outputs maintained in the hard decision output buffer are provided as a data output to a recipient device (block 361). Based upon the disclosure provided herein, one of ordinary skill in the art will recognize a variety of recipient devices that may be used in relation to different embodiments of the present invention.

Alternatively, where the decoded output failed to converge with the syndrome value of zero (block 316), it is determined whether the local iteration count has exceeded a local iteration limit (block 326). This local iteration limit may be, for example, ten local iterations. Where the number of local iterations has not yet been exceeded (block 326), the data decoding algorithm is re-applied to the currently processing data set for a subsequent local iteration guided by the decoded output to yield an updated decoded output (block 331). The processes beginning at block 416 are then repeated.

Alternatively, where the number of local iterations for the currently proceeding global iteration have been exceeded (block 326), it is determined if the maximum number of global iterations have already been applied to the currently processing data set (block 336). The number of global iterations may be complete where, for example, a timeout condition has occurred or a memory usage limitation has been exceeded. Where the global iterations are not complete (block 336), the decoded output is stored to the central memory as a standard output where it awaits processing in a subsequent global iteration (block 341). Alternatively, where the global iterations are complete (block 336), the currently processing data set is indicated as failing to (i.e., an error condition) (block 351).

Figure 3D:
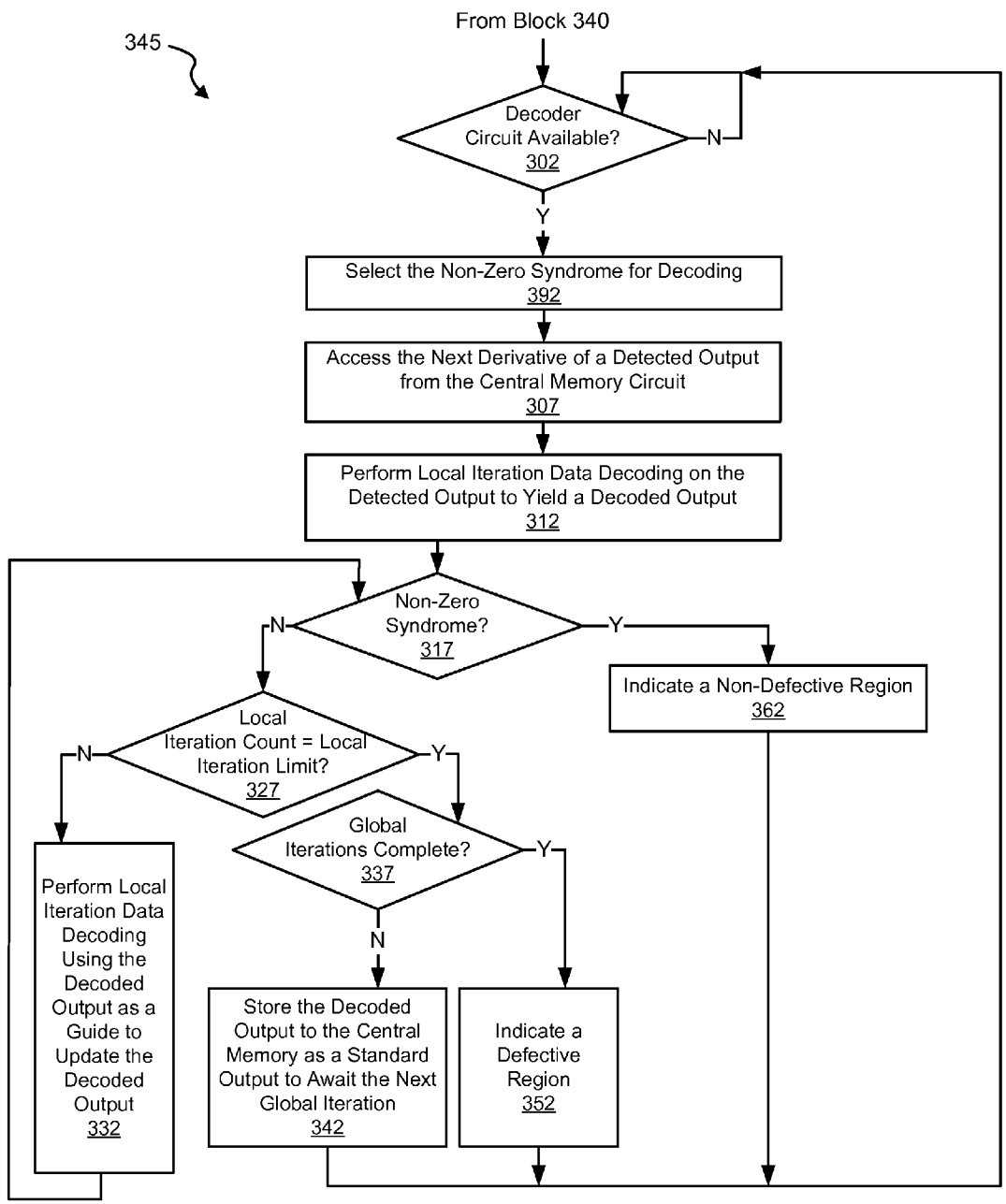

Turning to FIG. 3d, flow diagram 345 shows an implementation of the aforementioned defect scan processing. Following flow diagram 345, it is determined whether a decoder circuit is available to process a previously stored detected output (block 302). Where the decoder circuit is available (block 302), a non-zero syndrome value is selected for decoding (block 392). The non-zero syndrome value corresponds to the result achieved when decoding the test pattern written as part of flow diagram 399 described above. The next derivative of a detected output is selected for processing and accessed from the central memory circuit (block 307). A first local iteration of a data decoding algorithm is applied by the data decoder circuit to the selected detected output to yield a decoded output (block 312).

It is then determined whether the decoded output converged on the selected non-zero syndrome value (block 317). Where the data decoding algorithm converged on the non-zero syndrome value (block 317), a non-defective region is indicated (block 362). Otherwise, where the data decoding algorithm failed to converge on the non-zero syndrome value (block 317), it is determined whether the local iteration count has exceeded a local iteration limit (block 327). This local iteration limit may be, for example, ten local iterations.

Where the number of local iterations has not yet been exceeded (block 327), the data decoding algorithm is re-applied to the currently processing data set for a subsequent local iteration guided by the decoded output to yield an updated decoded output (block 332). The processes beginning at block 317 are then repeated.

Alternatively, where the number of local iterations for the currently proceeding global iteration have been exceeded (block 327), it is determined if the maximum number of global iterations have already been applied to the currently processing data set (block 337). The number of global iterations may be complete where, for example, a timeout condition has occurred or a memory usage limitation has been exceeded. Where the global iterations are not complete (block 337), the decoded output is stored to the central memory where it awaits processing in a subsequent global iteration (block 342). Alternatively, where the global iterations are complete (block 337), the currently processing data set is identified as a having come from a defective region of the storage medium (block 352).

In some cases of the processes discussed above in relation to FIGS. 3a-3c, the number of allowed global iterations and/or local iterations can be different for standard processing (i.e., blocks 326, 336) and defect scan processing (i.e., blocks 327, 337). For standard processing (blocks 326, 336), the allowed global iterations and/or local iterations are selected to assure the convergence of the highest percentage of sectors within a defined latency characteristic. In contrast, in defect scan processing (blocks 327, 337), the allowed global iterations and/or local iterations may be selected to operate as a threshold of acceptable numbers of defects in a region covered by a sector. Sectors that have a large percentage of defective area will not converge to the non-zero syndrome value regardless of how many global and local iterations are applied. In contrast, sectors that have very few defects will converge to the non-zero syndrome value after relatively few global and/or local iterations. Sectors with an intermediate number of defects will converge, but only after a larger number of global and/or local iterations than that required for the sectors with a low percentage of defective area. By modifying the number of allowable global and/or local iterations applied to processing the periodic pattern, a threshold of defects per sector can effectively be set.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data decoder circuit selectably operable to converge with a first syndrome value or a second syndrome value, wherein the first syndrome value corresponds to a test pattern, and wherein the second syndrome value corresponds to an encoded data set; and
    a sector defect indication circuit operable to identify a region of a storage medium as defective based at least in part on failure of the data decoder circuit to converge with the first syndrome value.

2. The data processing system of claim 1, wherein the region of the storage medium corresponds to the region from which the test pattern is stored.

3. The data processing system of claim 1, wherein the first syndrome value is non-zero and the second syndrome value is zero.

4. The data processing system of claim 3, wherein the first syndrome value is the value resulting from applying a data decoding algorithm by the data decoder circuit to the test pattern.

5. The data processing circuit of claim 1, wherein the test pattern is a 2T pattern.

6. The data processing system of claim 1, wherein the data decoder circuit is operable to apply a low density parity check decoding algorithm.

7. The data processing system of claim 1, wherein the data processing system further comprises:
    a data detection circuit operable to apply a data detection algorithm to a data input to yield a detected output; and
    wherein the data decoder circuit is operable to apply a data decoding algorithm to a data set derived from the detected output.

8. The data processing system of claim 7, wherein processing through both the data detection circuit and the data decoding circuit is a global iteration, and wherein:
    during processing of the test pattern a first number of global iterations are allowed, and during processing of the an encoded data set a second number of global iterations are allowed.

9. The data processing system of claim 7, wherein processing through both the data detection circuit and the data decoding circuit is a global iteration, wherein application of the data decoding algorithm during each global iteration is a local iteration, and wherein:
    during processing of the test pattern a first number of local iterations are allowed, and during processing of the an encoded data set a second number of local iterations are allowed.

10. The data processing system of claim 1, wherein the system further comprises:
    the storage medium; and
    a data write circuit selectably operable to write one of the test pattern and the encoded data set to the storage medium.

11. The data processing system of claim 1, wherein the data processing system is implemented as part of a storage device.

12. The data processing system of claim 1, wherein the data processing system is implemented as part of an integrated circuit.

13. A method for defect scanning, the method comprising:
storing a test pattern to a storage medium, wherein the test pattern corresponds to a non-zero syndrome value;
accessing the test pattern from the storage medium as a data input;
applying a data decoding algorithm using a data decoding circuit to a data set derived from the data input to yield a syndrome result; and
identifying a region of the storage medium where the test pattern is stored as defective based at least in part on a non-zero difference between the syndrome result an the non-zero syndrome value.

14. The method of claim 13, wherein the syndrome result is a first syndrome result, wherein the data set is a first data set, wherein the data input is a first data input, and wherein the method further comprises:
encoding a data set based upon a zero syndrome value to yield an encoded data set;
storing the encoded data set to the storage medium;
accessing the encoded data set from the storage medium as a second data input;
applying the data decoding algorithm to a second data set derived from the second data input to yield a second syndrome result and a decoded output; and
providing the decoded output as a correct data set when the second syndrome result is equal to zero.

15. The method of claim 14, wherein the method further comprises:
applying a data detection algorithm to a third data set derived from the first data input to yield a first detected output, wherein the first data set derived from the first data input is derived from the first detected output; and
applying a data detection algorithm to a fourth data set derived from the second data input to yield a second detected output, wherein the second data set derived from the second data input is derived from the second detected output.

16. The method of claim 15, wherein a combination of applying the data detection algorithm and the data decoding algorithm is a global iteration, and:
during processing of the test pattern a first number of global iterations are allowed, and during processing of the encoded data set a second number of global iterations are allowed.

17. The method of claim 16, wherein the method further comprises:
programming a first number of allowable global iterations for use during processing of the test pattern; and
programming a second number of allowable global iterations for use during processing of the encoded data set.

18. The method of claim 15, wherein a combination of applying the data detection algorithm and the data decoding algorithm is a global iteration, and wherein application of the data decoding algorithm during each global iteration is a local iteration, and wherein:
during processing of the test pattern a first number of local iterations are allowed, and during processing of the an encoded data set a second number of local iterations are allowed.

19. The method of claim 18, wherein the method further comprises:
programming a first number of allowable local iterations for use during processing of the test pattern; and
programming a second number of allowable local iterations for use during processing of the encoded data set.

20. A storage device, the storage device comprising:
a storage medium;
a head assembly disposed in relation to the storage medium and operable to provide a sensed signal corresponding to information on the storage medium;
a read channel circuit including:
an analog front end circuit operable to provide an analog signal corresponding to the sensed signal;
an analog to digital converter circuit operable to sample the analog signal to yield a series of digital samples;
an equalizer circuit operable to equalize the digital samples to yield a sample set;
a sample buffer operable to maintain the sample set;
a data decoder circuit selectably operable to converge with a first syndrome value or a second syndrome value, wherein the first syndrome value corresponds to a test pattern, and wherein the second syndrome value corresponds to an encoded data set; and
a sector defect indication circuit operable to identify a region of the storage medium as defective based at least in part on failure of the data decoder circuit to converge with the first syndrome value.

* * * * *